(12) United States Patent
Heck et al.

(10) Patent No.: US 6,879,621 B2
(45) Date of Patent: Apr. 12, 2005

(54) SPHERICAL LENS AND OPTOELECTRONIC MODULE COMPRISING THE SAME

(75) Inventors: Wolfgang Heck, Gerlingen (DE); Walter Joerg, Stuttgart (DE)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 10/155,981

(22) Filed: May 29, 2002

(65) Prior Publication Data

US 2002/0191655 A1 Dec. 19, 2002

(30) Foreign Application Priority Data

Jul. 18, 2001 (EP) .............................................. 01440227

(51) Int. Cl.[7] .............................. H01S 3/00; H01S 3/04
(52) U.S. Cl. ......................................... 372/108; 372/36
(58) Field of Search ............................ 372/36, 43, 108

(56) References Cited

U.S. PATENT DOCUMENTS

| 4,830,454 | A | | 5/1989 | Karstensen | |
| 4,836,435 | A | * | 6/1989 | Napp et al. | 228/180.22 |
| 4,904,036 | A | * | 2/1990 | Blonder | 385/14 |
| 5,659,566 | A | | 8/1997 | Takemoto | |
| 5,888,841 | A | * | 3/1999 | Synder | 438/33 |
| 6,172,997 | B1 | * | 1/2001 | Miyake et al. | 372/36 |
| 6,207,950 | B1 | * | 3/2001 | Verdiell | 250/239 |

OTHER PUBLICATIONS

Patent Abstracts of Japan vol. 1996, No. 08, Aug. 30, 1996 & JP 08 086902 A (Mitsubishi Electric Corp), Apr. 2, 1996.
Osenbach J W et al.: "Low Cost/High Volume Laser Modules Using Silicon Optical Bench Technology" 1998 Proceedings of the 48th Electronic Components and Technology Conference., ECTC 1998. Seattle, WA, May 25–28, 1998, Proceedings of the Electronic Components and Technology Conference, New York, NY: IEEE, US May 25, 1998, pp. 581–587.

* cited by examiner

Primary Examiner—Quyen Leung
(74) Attorney, Agent, or Firm—Moser, Patterson & Sheridan, L.L.P.

(57) ABSTRACT

A spherical lens (K) for an optoelectronic module has a plane surface that is provided with a solderable metal coating (M). The spherical lens (K) is soldered by means of its plane, metallized surface (M) onto a solder pad (P) applied to the substrate (T).

9 Claims, 1 Drawing Sheet

SPHERICAL LENS AND OPTOELECTRONIC MODULE COMPRISING THE SAME

FIELD OF THE INVENTION

The invention relates to a spherical lens for an optoelectronic module and to such a module comprising a spherical lens. Furthermore, the invention relates to a method for mounting such a spherical lens on a substrate of the module.

BACKGROUND OF THE INVENTION

Optical transmission methods are being increasingly used in telecommunications. For this purpose, reliable and inexpensive optoelectronic modules are required, for example as transmitter, receiver or regenerator ("transceiver").

Such a module, produced by the so-called SiOB (silicon optical bench) technology is disclosed in the article entitled "Low-Cost/High Volume Laser Modules Using Silicon Optical Bench Technology" by J. W. Osenbach et al., Electronic Components & Technology Conference 1998, pages 581–587. It comprises a silicon substrate with metallic solder pads and conductor tracks applied thereto. A laser chip and a photodiode are soldered onto the substrate, while a spherical lens is mounted on the substrate by means of so-called AlO bonding. AlO bonding is understood as meaning a procedure in which a silica (silicon oxide, $SiO_2$) body is pressed at high temperature onto an aluminium layer applied to the substrate. This produces a chemical bond between the $SiO_2$ and the Al.

A disadvantage of the known module is that the high processing temperatures necessary during bonding results in a degradation of the semiconductor chips (laser, photodiode) already mounted. In addition, it makes necessary precisely produced V-grooves for mounting the spherical lens in the correct position.

In an alternative mounting method, the spherical lens is glued on. This has the disadvantages that the adhesive compound has inadequate long-term stability and the optical quality of the module is reduced by outgassing of volatile reaction products of the adhesive.

The object of the invention is therefore to provide a mounting method for a spherical lens on an optical substrate, which method does not have the disadvantages described. Further objects of the invention are to provide a spherical lens suitable for such mounting and an electrooptical module comprising such a lens.

SUMMARY OF THE INVENTION

The object is achieved in that the spherical lens has a plane surface that is provided with a solderable metal coating and in that the spherical lens is soldered by means of its plane, metallized surface onto a solder pad applied to the substrate.

Advantages of the invention are that the mounting of the spherical lens is very reliable, that the adhesion of the lens is even improved further compared with known methods, in that a self-alignment that results in increased precision of the alignment in the optical axis with respect to the optosemiconductor chip occurs during the soldering as a result of the surface tension of the liquid solder, that semiconductor chips and lens can be soldered on simultaneously, thereby saving one processing step and that the method makes use of standard processing steps and the optoelectronic module according to the invention can therefore be produced in series production extremely inexpensively.

BRIEF DESCRIPTION OF THE DRAWINGS

The invention is explained below by reference to FIGS. 1 and 2 in an exemplary embodiment. In the figures.

DETAILED DESCRIPTION OF THE INVENTION

The basic idea of the invention is to mount a lens, preferably a spherical lens ("ball lens"), on a substrate of an optoelectronic module by soldering. For this purpose, one side of the lens is flattened and provided with a solderable metal coating.

Figure 1:
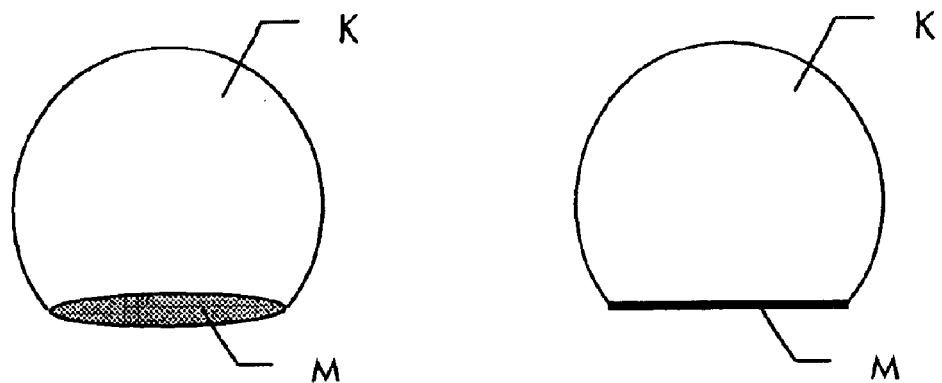
FIG. 1 shows a spherical lens according to the invention in a three-dimensional view and in section and FIG. 2 shows a spherical lens soldered onto a substrate.

FIG. 1 shows a spherical lens K according to the invention that has a plane surface. Applied to the plane surface is a solderable metal coating M. In the left-hand part of the figure, the spherical lens is shown in a three-dimensional view, while in the right-hand part it is shown in cross section through the centre of the sphere perpendicular to the surface M. The spherical lens comprises a glass such as silica (silicon oxide $SiO_2$). The metal coating comprises a plurality of metal layers, the lowermost being titanium with optionally either gold or a platinum layer on top of it and a gold layer on top of the latter. Other known solderable layer systems are likewise suitable.

For the purpose of production, a multiplicity of spherical lenses is fixed in a closely packed arrangement in a bath by means of a template or an embedding compound. The plane surface is produced as a result of resurfacing by grinding. Metallization with a solderable coating is then performed.

For this purpose, a suitable solderable layer system is applied by a suitable metallization method, such as sputtering (cathode-ray nebulization) or vapour deposition. The metallization may additionally be further reinforced by electroplating.

Figure 2:
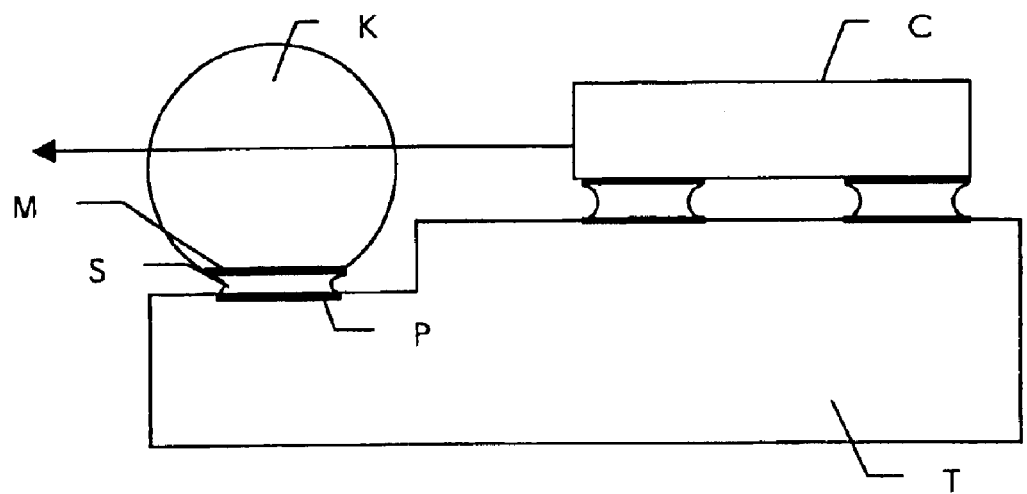

FIG. 2 shows an optoelectronic module that comprises a substrate T and a laser chip C disposed thereon and a spherical lens K. Laser chip C and spherical lens K are soldered on. The substrate is composed of crystalline silicon (Si) and is produced by a standard method. The spherical lens K is disposed in a recess on the substrate. Solder pads P ("solder bumps") for chip C and lens K and also, optionally, electrical conductor tracks are situated on the substrate. Solder pads for chip C and lens K are applied during the same processing step. The light exit direction and optical axis of the laser chip C are indicated by an arrow.

Chip C and lens K are soldered onto the solder pads P. For this purpose, chip C and lens K are positioned on the pads P and soldered simultaneously by means of a reflow soldering. A self-alignment of the prepositioned components with respect to one another takes place as a result of the surface tension. As a result, alignment aids on the substrate, such as stops, spacers, etc. can be dispensed with. The solder is denoted in the figure by S.

FIG. 2 is to be understood as a diagrammatic basic drawing that is not to scale, in particular in the regard to the recess into which the lens is soldered. Actually, the recess for the spherical lens may be a V-groove that is etched into the substrate and in which the solder pad is applied and the spherical lens is soldered, for example, as in the paper cited at the outset.

The invention is also not restricted to spherical lenses. On the contrary, other lens shapes, such as, for example, oval, concave, convex or cylindrical lenses can also be mounted using the same principle.

As explained above, only standard and well-controlled processing steps are used. As a result, the mounting of the lens can be incorporated without difficulty in existing and qualified production processes for so-called submounts. In addition, the invention has the advantage that it manages without organic adhesives. In addition to that, it has the advantage that the contact surface of the sphere does not comprise only single points, as in the known bonding methods. As a result, the adhesion of the lens is appreciably improved.

What is claimed is:

1. An optoelectronic module, comprising:
    a substrate, one or more optoelectronic components disposed on the substrate, and a solder pad on the substrate; and
    a lens, wherein the lens is substantially spherical and has a plane surface provided with a metal coating, and wherein the metal coating of the lens is soldered onto the solder pad.

2. An optoelectronic module according to claim 1, wherein the substrate comprises crystalline silicon.

3. An optoelectronic module according to claim 1, wherein the lens is positioned in a recess in the substrate.

4. An optoelectronic module according to claim 1, wherein said lens is self aligned on said substrate.

5. A method for mounting a lens on a substrate containing a solder pad, comprising:
    introducing a plane surface on the lens, wherein the lens is substantially spherical,
    metallizing the plane surface with a solderable metal coating to form a plane metallized surface, and
    soldering the plane metallized surface onto the solder pad.

6. The method according to claim 5, wherein metallizing is performed by sputtering.

7. The method according to claim 5, wherein metallizing is performed by vapor deposition.

8. The method according to claim 5, further comprising reinforcing said metallizing by electroplating.

9. The method according to claim 5, wherein the plane surface is introduced by grinding.

* * * * *